(12) United States Patent
Jeon (10) Patent No.: US 10,288,689 B2
(45) Date of Patent: May 14, 2019

(54) APPARATUS AND METHOD FOR DETECTING CURRENT LEAKAGE IN BATTERY MODULE

(71) Applicant: SAMSUNG ELECTRONICS CO., LTD., Suwon-si (KR)

(72) Inventor: Jin Yong Jeon, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 115 days.

(21) Appl. No.: 15/141,171

(22) Filed: Apr. 28, 2016

(65) Prior Publication Data

US 2016/0370430 A1 Dec. 22, 2016

(30) Foreign Application Priority Data

Jun. 19, 2015 (KR) ........................ 10-2015-0087721

(51) Int. Cl.
*G01R 31/36* (2019.01)
*G01R 31/02* (2006.01)
*B60L 11/18* (2006.01)
*H02J 7/00* (2006.01)

(52) U.S. Cl.
CPC ........ *G01R 31/3606* (2013.01); *B60L 11/182* (2013.01); *B60L 11/1861* (2013.01); *G01R 31/025* (2013.01); *H02J 7/0029* (2013.01)

(58) Field of Classification Search
CPC .................................................. H02J 7/0042
USPC ..................................................... 320/107
See application file for complete search history.

(56) References Cited

U.S. PATENT DOCUMENTS

| | | | |
|---|---|---|---|
| 6,582,840 B2 | 6/2003 | Hortop | |
| 6,638,650 B1 | 10/2003 | Bailey et al. | |
| 8,779,784 B2 | 7/2014 | Yang et al. | |
| 9,024,646 B2 | 5/2015 | Huh | |
| 9,069,024 B2 | 6/2015 | Yang | |
| 2002/0094460 A1 | 7/2002 | Hortop | |
| 2004/0019441 A1* | 1/2004 | Larson | H02J 7/1453 702/63 |
| 2005/0012506 A1 | 1/2005 | Yudahira | |
| 2009/0108850 A1 | 4/2009 | Yamagami et al. | |
| 2009/0218986 A1* | 9/2009 | Jarvinen | B60L 11/185 320/119 |
| 2012/0235483 A1* | 9/2012 | Rigby | H01M 10/482 307/29 |
| 2012/0306287 A1* | 12/2012 | Kim | H02J 17/00 307/104 |
| 2013/0187471 A1* | 7/2013 | Kim | H02J 1/10 307/66 |
| 2013/0323553 A1 | 12/2013 | Bergmann | |

FOREIGN PATENT DOCUMENTS

| | | |
|---|---|---|
| JP | 7-203601 A | 8/1995 |
| JP | 8-294225 A | 11/1996 |
| JP | 2000-123883 A | 4/2000 |
| JP | 2003-194870 A | 7/2003 |

(Continued)

*Primary Examiner* — Yalkew Fantu
(74) *Attorney, Agent, or Firm* — NSIP Law (57) ABSTRACT

An apparatus for detecting leakage current of a battery module includes a current measurer configured to measure currents at both ends of a battery module, and a leakage detector configured to determine whether current is leaking out of the battery module based on the measured currents.

20 Claims, 10 Drawing Sheets

(56) References Cited

FOREIGN PATENT DOCUMENTS

| | | |
|---|---|---|
| JP | 2003-194871 A | 7/2003 |
| JP | 2004-104923 A | 4/2004 |
| JP | 2009-85830 A | 4/2009 |
| JP | 2009-287983 A | 12/2009 |
| JP | 2010-8356 A | 1/2010 |
| JP | 2012-521561 A | 9/2012 |
| JP | 2013-32977 A | 2/2013 |
| JP | 2013-140162 A | 7/2013 |
| JP | 2013-537313 A | 9/2013 |
| JP | 2014-59211 A | 4/2014 |
| JP | 2014-90635 A | 5/2014 |
| KR | 1999-0035008 A | 5/1999 |
| KR | 10-1065583 B1 | 9/2011 |
| KR | 10-2014-0148097 A | 12/2014 |

\* cited by examiner

APPARATUS AND METHOD FOR DETECTING CURRENT LEAKAGE IN BATTERY MODULE

CROSS-REFERENCE TO RELATED APPLICATIONS

This application claims the benefit under 35 USC 119(a) of Korean Patent Application No. 10-2015-0087721 filed on Jun. 19, 2015, in the Korean Intellectual Property Office, the entire disclosure of which is incorporated herein by reference for all purposes.

BACKGROUND

1. Field

The following description relates to an apparatus and a method for detecting leakage current in a battery module.

2. Description of Related Art

With the recently increasing interest in eco-friendly means of transport, much research on electric vehicles, hybrid electric vehicles, and electric bicycles has been conducted. In particular, research on high-power, large-capacity batteries for driving such means of transport are ongoing.

In implementation of high-power, large-capacity batteries, a plurality of battery cells are generally connected in series to form a battery module, and a number of battery modules are connected to each other via a connection member, such as a busbar, thereby forming a battery pack that can provide higher power and larger capacity.

If used in a high-temperature and high-vibration environment, such as a vehicle, insulation of the battery modules of the battery module may be damaged by the high temperature and vibrations, which may cause current leakage to occur, which may cause electric shock, performance degradation of the battery, and fire.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an apparatus for detecting leakage current includes a current measurer configured to measure currents at both ends of a battery module; and a leakage detector configured to determine whether current is leaking out of the battery module based on the measured currents.

The leakage detector may be further configured to compare magnitudes of the measured currents with each other, and determine that current is leaking out of the battery module in response to a result of the comparing being that a magnitude difference between the measured currents is greater than a threshold.

The apparatus may further include a charge/discharge determiner configured to determine whether the battery module is charging or discharging.

The charge/discharge determiner may be further configured to determine whether the battery module is charging or discharging based on a flow direction of the measured currents.

The current measurer may be further configured to measure a current at a positive terminal of the battery module at one end of the battery module, and measure a current at a negative terminal of the battery module at another end of the battery module; and the charge/discharge determiner may be further configured to determine that the battery module is charging in response to the flow direction of the measured currents indicating that a current is flowing from the positive terminal of the battery module to the negative terminal of the battery module, and determine that the battery module is discharging in response to the flow direction of the measured currents indicating that a current is flowing from the negative terminal of the battery module to the positive terminal of the battery module.

The current measurer may be further configured to measure a current at a positive terminal of the battery module at one end of the battery module, and measure a current at a negative terminal of the battery module at another end of the battery module; and the leakage detector may be further configured to determine that current is leaking out of the battery module in response to the current measured at the positive terminal of the battery module being greater than the current measured at the negative terminal of the battery module and the charge/discharger determiner determining that the battery module is charging, and determine that current is leaking out of the battery module in response to the current measured at the negative terminal of the battery module being greater than the current measured at the positive terminal of the battery module and the charge/discharger determiner determining that the battery module is discharging.

The apparatus may further include a damage detector configured to calculate a degree of insulation damage by calculating a magnitude difference between the measured currents.

The damage detector may be further configured to generate a warning signal in response to the magnitude difference being greater than a first threshold and less than a second threshold, and generate a power cutoff signal in response to the magnitude difference being greater than the second threshold.

The current measurer may be further configured to measure the currents using either a hole sensor or a shunt resistor.

In another general aspect, a method of detecting leakage current includes measuring currents at both ends of a battery module; and determining whether current is leaking out of the battery module based on the measured currents.

The determining of whether current is leaking out of the battery module may include comparing magnitudes of the measured currents with each other; and determining that current is leaking out of the battery in response to a result of the comparing being that a magnitude difference between the measured currents is greater than a threshold.

The method may further include determining whether the battery module is charging or discharging.

The determining of whether the battery module is charging or discharging may include determining whether the battery module is charging or discharging based on a flow direction of the measured currents.

The measuring may include measuring a current at a positive terminal of the battery module at one end of the battery module, and measuring a current at a negative terminal of the battery module at another end of the battery module; and the determining of whether the battery module is charging or discharging based on a flow direction of the measured currents may include determining that the battery module is charging in response to the flow direction of the measured currents indicating that a current is flowing from the positive terminal of the battery module to the negative terminal of the battery module, and determining that the battery module is discharging in response to the flow direction of the measured currents indicating that a current is flowing from the negative terminal of the battery module to the positive terminal of the battery module.

The measuring may include measuring a current at a positive terminal of the battery module at one end of the battery module, and measuring a current at a negative terminal of the battery module at another end of the battery module; and the determining of whether current is leaking out of the battery module may include determining that current is leaking out of the battery module in response to the current measured at the positive terminal of the battery module being greater than the current measured at the negative terminal of the battery module and a result of the determining of whether the battery module is charging or discharging being that the battery module is charging, and determining that current is leaking out of the battery module in response to the current measured at the negative terminal of the battery module being greater than the current measured at the positive terminal of the battery module and a result of the determining of whether the battery module is charging or discharging being that the battery module is discharging.

The method may further include calculating a degree of insulation damage by calculating a magnitude difference between the measured currents.

The calculating of the degree of insulation damage may include generating a warning signal in response to the magnitude difference being greater than a first threshold and less than a second threshold; and generating a power cutoff signal in response to the magnitude difference being greater than the second threshold.

The measuring may include measuring the currents using either a hole sensor or a shunt resistor.

In another general aspect, an electric vehicle includes a battery module; a current measurer configured to measure currents at both ends of the battery module; and a leakage detector configured to determine whether current is leaking out of the battery module based on the measured currents.

The electric vehicle may further include a target resonator configured to receive wireless power from a source resonator via magnetic resonance between the target resonator and the source resonator, and output the received power; and a target system configured to receive the power output from the target resonator, convert the power received from the target resonator to a charging power, and charge the battery module with the charging power.

The target system may include the current measurer and the leakage detector.

Other features and aspects will be apparent from the following detailed description, the drawings, and the claims.

BRIEF DESCRIPTION OF THE DRAWINGS

Throughout the drawings and the detailed description, the same reference numerals refer to the same elements. The relative size, proportions, and depiction of elements may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

Figure 1:
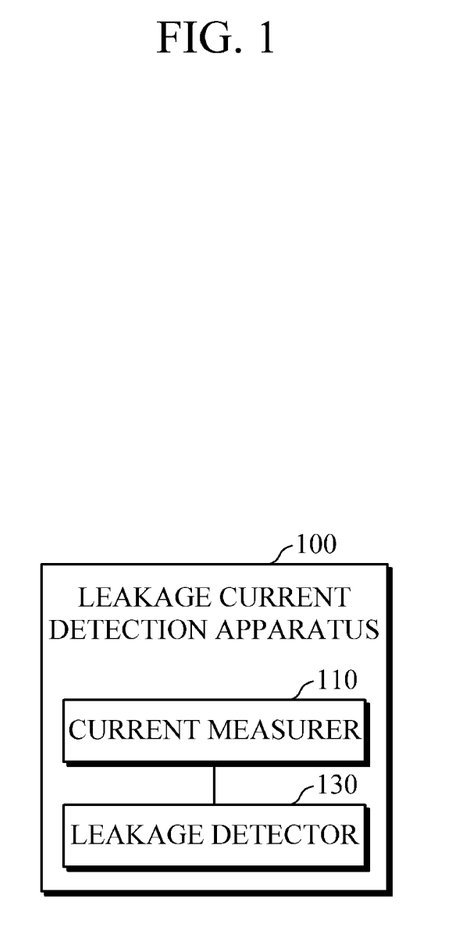
FIG. 1 is a diagram illustrating an example of a configuration of an apparatus for detecting leakage current.

FIG. 1 is a diagram illustrating an example of a configuration of an apparatus for detecting leakage current.

Referring to FIG. 1, a leakage current detection apparatus 100 includes a current measurer 110 and a leakage detector 130.

The current measurer 110 measures a current at both ends of a battery module.

A single battery module may be used alone, or a plurality of battery modules connected in series may be used. For example, if a single battery module is used, the current measurer 110 measures current at both ends (i.e., the positive terminal and the negative terminal) of the battery module. In addition, if battery modules connected in series are used, the current measurer 110 may measure current at both ends of each battery module. The current measured at both ends of two battery modules connected in series is a current measured at the positive terminal of one battery module, and a current measured at the negative terminal of the other battery module.

The current measurer 110 may measure the current using either a hole sensor or a shunt resistor.

The hole sensor is a device that produces an output signal having a voltage that changes according to the intensity of a magnetic field, and measures current based on a magnetic field directed orthogonally to a current flowing in a conductor inserted into the center of a metal pin. Hence, it is possible to measure the current flowing in the battery module by connecting the hole sensor to a cable or busbar connected to the battery module.

The shunt resistor has a very low resistance and is used for current measurement. The shunt resistor is connected in series with a conductor through which current is flowing. The current flowing in the conductor is measured by measuring a voltage generated across the shunt resistor. A current flowing in the battery module may be measured by connecting the shunt resistor in series with the cable or busbar connected to the battery module.

However, the current measurer 110 is not limited to the above examples, but may use any method of measuring the current known to one of ordinary skill in the art.

The current measurer's method of measuring current of the battery module will be described below with reference to FIG. 3.

The leakage detector 130 determines whether current leaks out of a battery module based on the measured current.

Theoretically, if no current leaks out of the battery module, the measured current should be the same in magnitude and direction at both ends of the battery module. If a plurality of battery modules are connected in series, the measured current between the two battery modules connected in series should be the same in magnitude and direction at both battery modules. However, if current leakage occurs in any of the battery modules, the measured current will be different at both ends of the battery module with current leakage. Accordingly, the leakage detector 130 measures currents at both ends of a battery module and compares the magnitudes of the currents. If the magnitudes are different, the leakage detector 130 determines that current leaks out of the battery module.

In the case where a plurality of battery modules are connected in series, voltages measured at both ends of each battery module may vary with the temperature of the battery module, the size of a load, the battery module's state, and other factors. In contrast, in the case where a current is measured at both ends of the array of battery modules connected in series, the measured currents will the same as each other if no current leakage occurs in any of the battery modules, regardless of the temperature of each battery module, the size of the load, and the state of each battery module. Hence, by using the current flowing through the battery module, it is possible to detect whether there is a leakage current and to accurately measure the amount of leakage current.

In one example, the leakage detector 130 compares the magnitude of current measured at both ends of the battery module. When the difference between the two measured currents is greater than a threshold, the leakage detector 130 determines that current leaks out of the battery module.

As described above, if no current leaks out of the battery module, the currents measured at both ends of the battery theoretically should be the same in magnitude and direction. However, errors in sensors or other parts used to measure current may cause a discrepancy in the measurements. Hence, the threshold may be set to take into account measurement errors, and the leakage detector 130 may determine that current leakage occurs when the difference between the currents measured at both ends of the battery module is greater than the threshold. In other words, it may be assumed that a difference less than the threshold is due to either a measurement error or an insignificant current leakage, and a difference greater than the threshold is due to a significant current leakage that should be brought to the attention of the user or the system.

Figure 2:
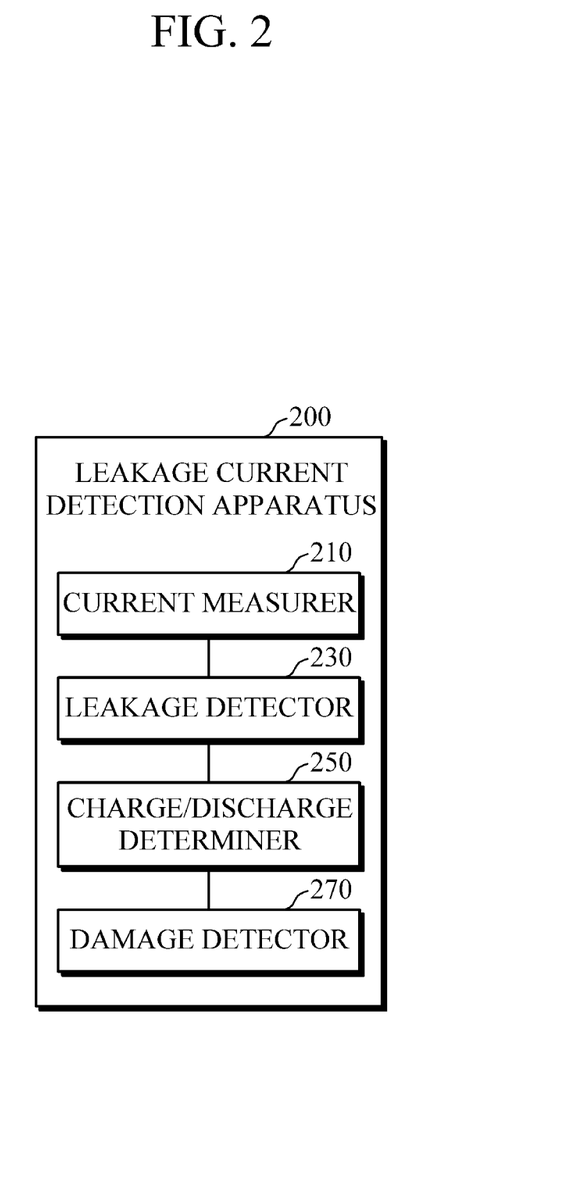
FIG. 2 is a diagram illustrating another example of a configuration of an apparatus for detecting leakage current.

FIG. 2 is a diagram illustrating another example of a configuration of an apparatus for detecting leakage current.

Referring to FIG. 2, a leakage current detection apparatus 200 includes a current measurer 210, a leakage detector 230, a charge/discharge determiner 250, and a damage detector 270.

The current measurer 210 and the leakage detector 230 shown in FIG. 2 have the same configurations as those of the current measurer 110 and the leakage detector 130 shown in FIG. 1, and thus detailed descriptions thereof will be omitted.

The charge/discharge determiner 250 determines whether a battery module is charging or discharging.

A direction of a current flow in the battery module changes according to whether the battery module is charging or discharging. Thus, in order to detect leakage current, it is necessary to determine whether the battery module is charging or discharging.

In one example, based on the direction of a current flow in the battery module, it is determined whether the battery module is charging or discharging. For example, when the battery module is charging, a current flows from the positive terminal to the negative terminal of the battery module. In contrast, when the battery module is discharging, a current flows from the negative terminal to the positive terminal of the battery module. Accordingly, the charge/discharge determiner 250 is able to determine whether the battery module is charging or discharging based on the flow direction of the measured current.

Moreover, the leakage detector 230 determines whether current leaks out of the battery module based on the determination of whether the battery module is charging or discharging. For example, when the battery module is charging, the leakage detector 230 determines that there is current leakage if the magnitude of current measured at the positive terminal is greater than the magnitude of current measured at the negative terminal of the battery module. When the battery is discharging, the leakage detector 230 determines that there is current leakage if the magnitude of current measured at the negative terminal is greater than the magnitude of current measured at the positive terminal of the battery module.

The damage detector 270 calculates a degree of damage of insulation by calculating a magnitude difference between the currents measured at both ends of the battery module.

In one example, the degree of damage of insulation is determined based on the amount of leakage current. For example, if the leakage current is small, the degree of damage is determined to be small, and if the leakage current is large, the degree of damage is determined to be large.

The damage detector 270 may generate a warning signal when the calculated magnitude difference is greater than a first threshold, and may generate a power cutoff signal when the magnitude difference is greater than a second threshold.

The probability of the occurrence of accidents involving electric shock, battery damage, fire, and other failures varies depending on the amount of the leakage current. Hence, there is a need for generating a warning signal according to the magnitude of leakage current so that a user or a system that utilizes the battery module can take an appropriate action.

In one example, the damage detector 270 does not generate a warning signal if the magnitude of leakage current is less than the first threshold.

Moreover, if the magnitude of leakage current is greater than the first threshold and less than the second threshold, the damage detector 270 sends out a warning signal to inform the user or the system that current is leaking from the battery module. In this case, a warning display (not shown) may use a flashing signal or an audio signal to warn the user that current is leaking from the battery module.

Furthermore, if the magnitude of leakage current is greater than the second threshold, the damage detector 270 generates a power cutoff signal to immediately stop the use of the battery module. In this case, a battery manager (not shown) cuts off the power supply from the battery in response to the power cutoff signal.

Figure 3:
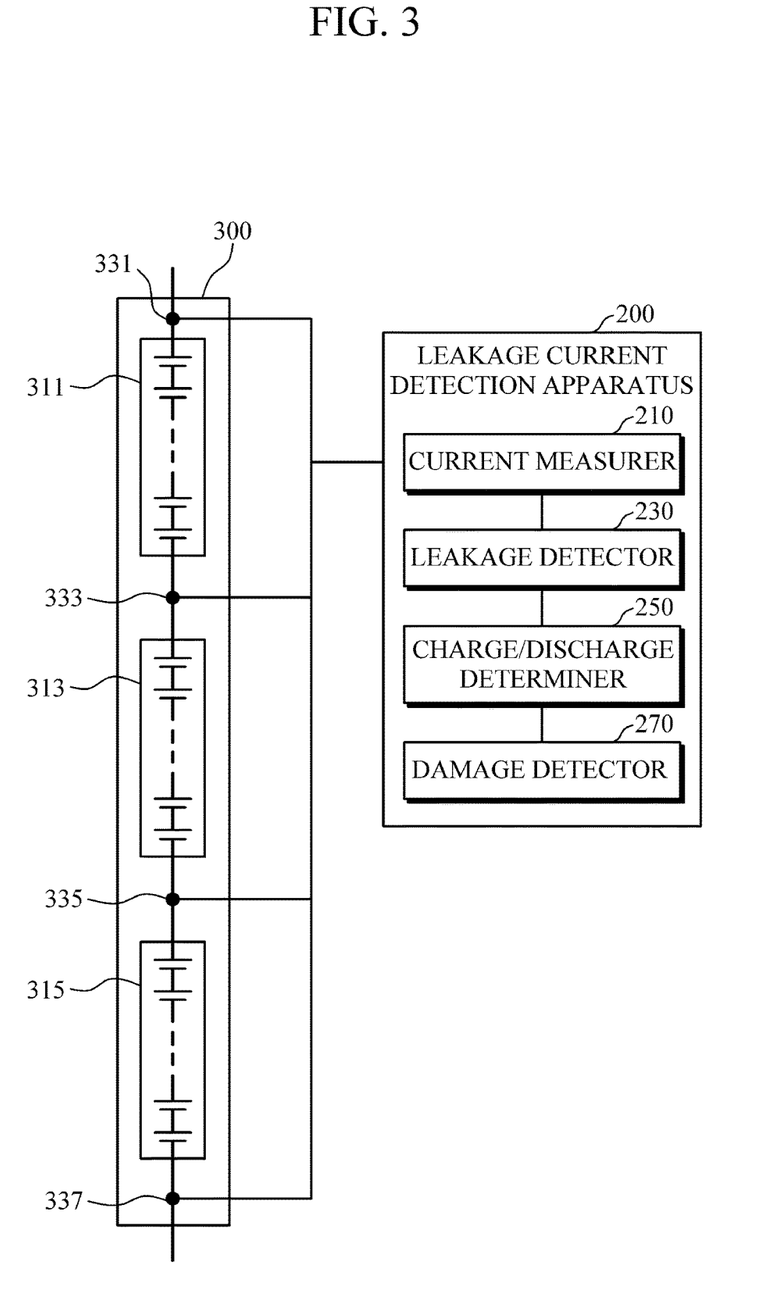
FIG. 3 is a diagram for explaining an example of a method of detecting leakage current.

FIG. 3 is a diagram for explaining an example of a method of detecting leakage current.

Referring to FIG. 3, the leakage current detection apparatus 200 is connected to a battery pack 300.

In one example, the battery packet 300 has a plurality of battery modules 311, 313, and 315 connected in series with each other.

The current measurer 210 measures currents of the battery modules at arbitrary measurement points 331, 333, 335, and 337 within the battery pack 300.

For example, if the battery pack 300 consists of a plurality of battery modules 311, 313, and 315, the current measurer 210 measures currents at the measurement points 331, 333, 335, and 337. In the example in FIG. 3, the measurement points 331 and 333 are both ends of the battery module 311, the measurement points 333 and 335 are both ends of the battery module 313, and the measurement points 335 and 337 are both ends of the battery module 315.

The leakage detector 230 determines whether there is leakage current by comparing currents measured at the measurement points 331, 333, 335, and 337 with each other. For example, if currents measured at the points 333 and 335 are different from each other, the leakage detector 230 determines that current leaks from the battery module 313.

In another example, if the battery pack 300 consists of a plurality of battery modules 311, 313, and 315, the current measurer 210 measures current at the measurement points 331 and 337. In this case, the measurement points 331 and 337 are both ends of an array of the battery modules 311, 313, and 315.

The leakage detector 230 determines whether there is leakage current by comparing currents measured at the measurement points 331 and 337. For example, if the currents measured at the points 331 and 337 are different from each other, the leakage detector 230 determines that current leaks from the array of battery modules 311, 313, and 315.

Also, if the battery pack 300 consists of a single battery module 311, the current measurer 210 measures the current at the measurement points 331 and 333. The measurement points 331 and 333 are both ends of the battery module 311. The leakage detector 230 determines whether current leaks out of the battery module 311 based on the currents measured at both ends 331 and 333 of the battery module 311.

In other words, the current measurer 210 may measure current at all or some of the measurement points 331, 333, 335, and 337 within the battery pack 300, and the expression "both ends of a battery module" may refer to both ends of a battery module or a group or array of battery modules existing between two adjacent measurement points.

In one example, if current is measured at all available measurement points, it is possible to accurately detect the battery module from which current leaks.

Figure 4A:
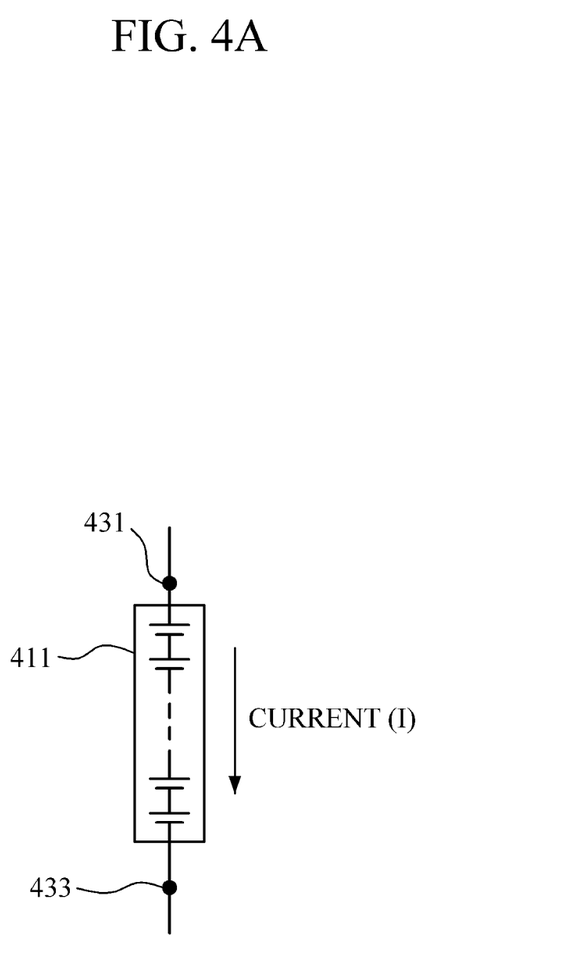
FIGS. 4A and 4B are diagrams for explaining an example of a method of detecting leakage current based on whether a battery module is charging or discharging.
Figure 4B:
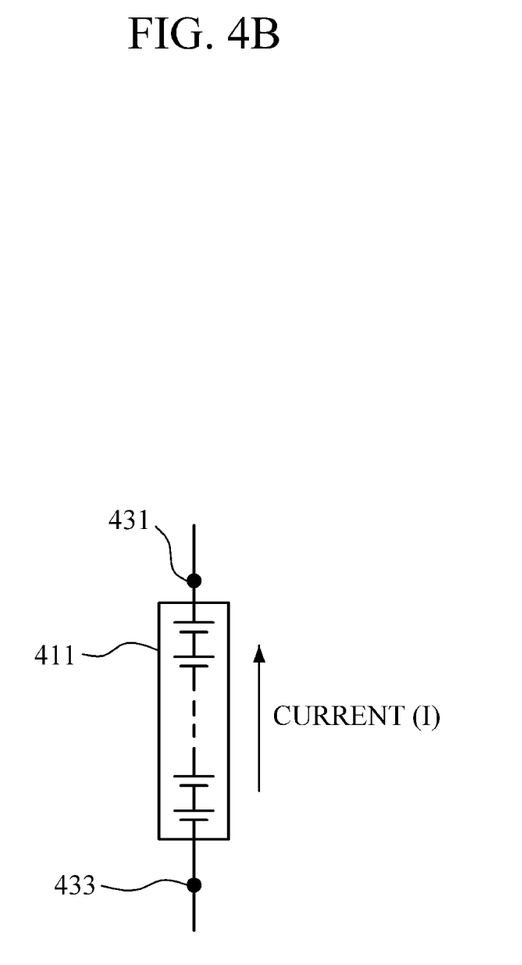

FIGS. 4A and 4B are diagrams for explaining an example of a method of detecting leakage current based on whether a battery module is charging or discharging.

Referring to FIGS. 2, 4A, and 4B, the charge/discharge determiner 250 determines whether a battery module 411 is charging or discharging based on a flow direction of the measured current. For example, when the battery module 411 is charging, current flows from a positive terminal 431 to a negative terminal 433 of the battery module 411. In contrast, when the battery module 411 is discharging, current flows from the negative terminal 433 to the positive terminal 431 of the battery module 411. Hence, based on the flow direction of measured current, the charge/discharge determiner 250 is able to determine whether the battery module 411 is charging or discharging.

FIG. 4A shows a current flow in the battery module 411 when the battery module 411 is charging. Referring to FIG. 4A, when the battery module 411 is charging, current flows from the positive terminal 431 to the negative terminal 433 of the battery module 411. The charge/discharge determiner 250 determines whether the battery module 411 is charging based on the direction of a current flow at at least one of the positive terminal 431 and the negative terminal 433.

FIG. 4B shows a current flow in the battery module 411 when the battery module 411 is discharging. Referring to FIG. 4B, when the battery module 411 is discharging, current flows from the negative terminal 433 to the positive terminal 431 of the battery module 411. The charge/discharge determiner 250 determines whether the battery module 411 is discharging based on the direction of current flow at at least one of the positive terminal 431 and the negative terminal 433.

When the battery module 411 is charging, if the current measured at the positive terminal 431 is greater than the current measured at the negative terminal 433, the leakage detector 230 determines that there is current leakage in the battery module 411. When the battery module 411 is discharging, if the current measured at the negative terminal 433 is greater than the current measured at the positive terminal 431, the leakage detector 230 determines that there is current leakage from the battery module 411.

Referring to FIGS. 2 and 4A, when the battery module 411 is charging, current flows from the positive terminal 431 to the negative terminal 433 in the battery module 411. Accordingly, if current leaks out of the battery module 411, some of the current flowing into the positive terminal 431 leaks out of the battery module 411, so that the magnitude of current flowing out of the negative terminal 433 is less than the current flowing into the positive terminal 431. Therefore, when the battery module 411 is charging, if the magnitude of current measured at the positive terminal 431 is greater than the magnitude of current measured at the negative terminal 433, the leakage detector 230 determines that there is current leakage from the battery module 411.

Referring to FIGS. 2 and 4B, when the battery module 411 is discharging, current flows from the negative terminal 433 to the positive terminal 431 in the battery module 411. Accordingly, if current leaks out of the battery module 411, some of the current flowing into the negative terminal 433 leaks out of the battery module 411, so that the magnitude of current flowing out of the positive terminal 431 is less than the current measured at the negative terminal 433. Hence, when the battery module 411 is discharging, if the magnitude of current measured at the negative terminal 433 is greater than the magnitude of current measured at the positive terminal 431, the leakage detector 230 determines that there is current leakage from the battery module 411.

Figure 5:
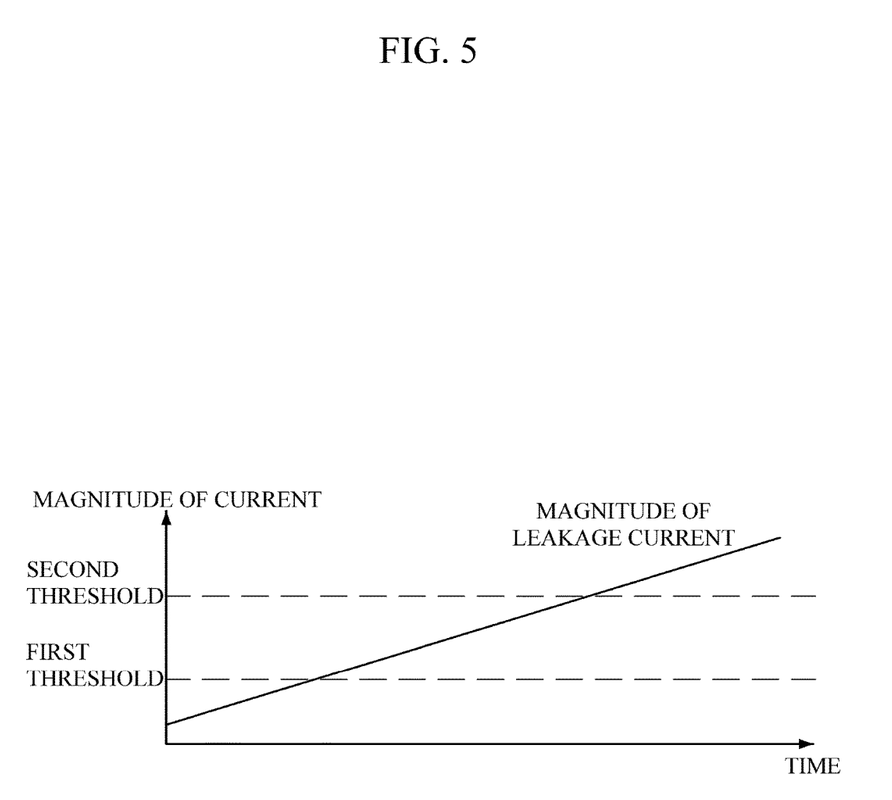
FIG. 5 is a graph for explaining an example of a method of calculating a degree of damage of insulation based on the magnitude of leakage current.

FIG. 5 is a graph for explaining an example of a method of calculating a degree of damage of insulation based on the magnitude of leakage current.

Referring to FIGS. 2 and 5, as the insulation damage increases over time, the magnitude of leakage current also increases. In this case, the damage detector 270 calculates the magnitude of leakage current based on the magnitude of the current measured by the current measurer 210. For example, the magnitude $I_{leak}$ of leakage current is $|I^+ - I^-|$, where $I^+$ denotes the current measured at the positive terminal of the battery module and $I^-$ denotes the current measured at the negative terminal of the battery module.

The damage detector 270 does not generate a warning signal if the magnitude $I_{leak}$ of leakage current is less than the first threshold.

By contrast, if the magnitude $I_{leak}$ of leakage current, which increases over time, increases to between the first threshold and the second threshold, the damage detector 270 generates a warning signal to inform the user or the system that current is leaking from the battery module. Also, if the magnitude $I_{leak}$ of leakage current continues to increase until it exceeds the second threshold, the damage detector 270 generates a power cutoff signal to immediately stop the use of the battery module.

The number and range of thresholds are not be limited to the above examples, such that at least one threshold may be set and the damage detector 270 may execute a predesignated operation according to each threshold.

Figure 6:
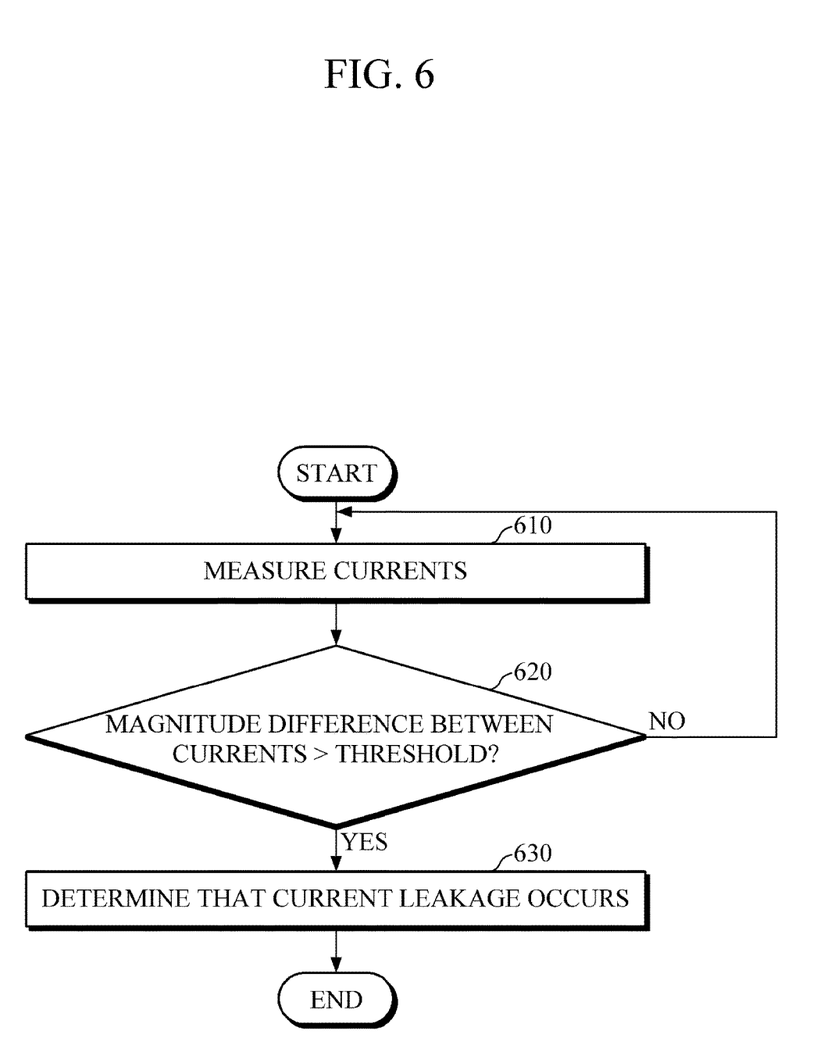
FIG. 6 is a flowchart illustrating an example of a method of detecting leakage current.

FIG. 6 is a flowchart illustrating an example of a method of detecting leakage current.

Referring to FIGS. 1 and 6, in operation 610, the leakage current detection apparatus 100 measures currents to determine whether or not current leaks out of the battery module.

For example, in the case where a single battery module is used, the leakage current detection apparatus 100 measures the current at both ends (i.e., the positive and negative terminals) of the battery module.

In another example, in the case where a battery pack includes a plurality of battery modules connected in series, the leakage current detection apparatus 100 measures current at all or some of measurement points within the battery pack. In this case, the expression "both ends of a battery module" may refer to both ends of a battery module, or both ends of a group of battery modules between two adjacent measurement points. The current measured at both ends of two battery modules connected in series is a current measured at the positive terminal of one battery module, and a current measured at the negative terminal of the other battery module.

Thereafter, in operation 620, the leakage current detection apparatus 100 determines whether the magnitude difference between the currents at both ends of the battery module is greater than a threshold based on the measured currents.

Theoretically, if no current leaks out of a battery module, the measured current should be the same in magnitude and direction at both ends of the battery module. However, if current leakage occurs in any of battery modules, the measured current will be different at both ends of the battery module experiencing the current leakage. Accordingly, currents are measured at both ends of a battery module, after which the magnitudes or directions of the measured currents are compared to each other. If the measured currents are different in direction or magnitude, the leakage detector 130 determines that current leaks out of the battery module.

However, errors in sensors or other parts used to measure current may cause a discrepancy in the measurements. Hence, the threshold may be set to take into account measurement errors, and the leakage current detection apparatus 100 determines that current leakage occurs when the difference between the currents measured at both ends of the battery module is greater than the threshold.

If the comparison result shows that the magnitude difference between the measured currents is less than the threshold, the leakage current apparatus 100 measures the currents again in operation 610. By contrast, if the magnitude difference is greater than the threshold, the leakage current detection apparatus 100 determines that current leakage occurs in operation 630.

Figure 7:
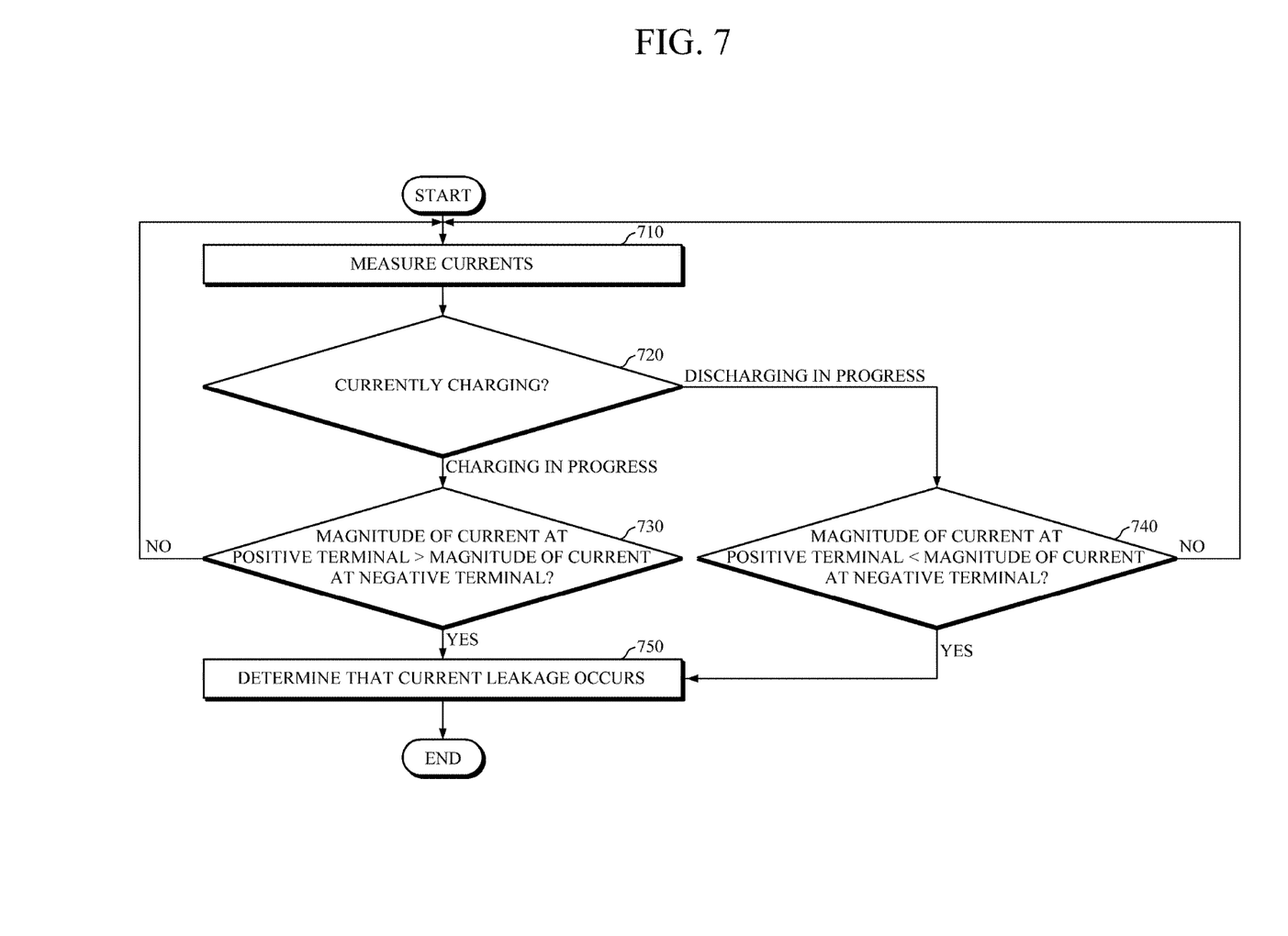
FIG. 7 is a flowchart illustrating an example of a method of detecting leakage current based on whether a battery module is charging or discharging.

FIG. 7 is a flowchart illustrating an example of a method of detecting leakage current based on whether a battery module is charging or discharging.

Referring to FIGS. 2 and 7, in operation 710, the leakage current detection apparatus 200 measures currents, and thereafter, determines whether the battery module is charging or discharging based on the flow direction of the measured currents in operation 720.

In one example, based on the direction of a current flow in the battery module, the leakage current detection apparatus 200 determines whether the battery module is charging or discharging. For example, when the battery module is charging, a current flows from the positive terminal to the negative terminal of the battery module. In contrast, when the battery module is discharging, a current flows from the negative terminal to the positive terminal of the battery module. Accordingly, the leakage current detection apparatus 200 is able to determine whether the battery module is charging or discharging based on the flow direction of the measured currents. Thereafter, the leakage current detection apparatus 200 determines whether current leakage occurs based on whether the battery module is charging or discharging.

In the case of a battery module in question charging, the leakage current detection apparatus 200 determines whether the current measured at the positive terminal of the battery module is greater than the current measured at the negative module of the battery module in operation 730.

If a result of the determination is that the current measured at the positive terminal is greater than the current measured at the negative terminal, the leakage current detection apparatus 200 determines that current leaks out of the battery module in operation 750. Otherwise, the leakage current detection apparatus 200 returns to operation 710 in which the leakage current detection apparatus 200 measures currents again.

In the case of a battery module in question discharging, the leakage current detection apparatus 200 determines whether the current measured at the negative terminal of the battery module is greater than the current measured at the positive terminal in operation 740.

If a result of the determination is that the current measured at the negative terminal is greater than the current measured at the positive terminal, the leakage current detection apparatus 200 determines that current leaks out of the battery module in operation 750. Otherwise, the leakage current detection apparatus 200 returns to operation 710 in which the leakage current detection apparatus 200 measures currents again.

Figure 8:
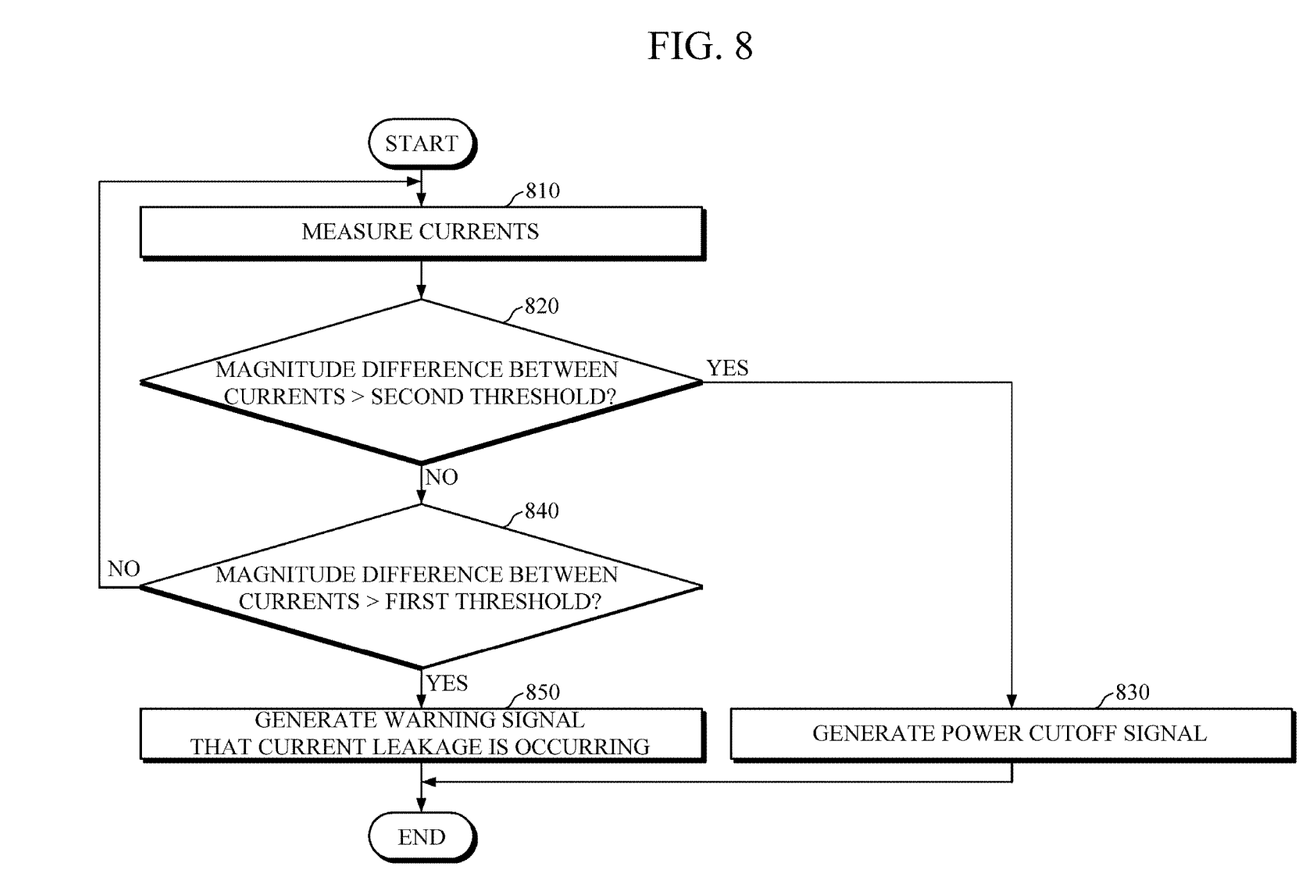
FIG. 8 is a flowchart illustrating an example of a method of generating a warning signal by calculating a degree of insulation damage based on the magnitude of leakage current.

FIG. 8 is a flowchart illustrating an example of a method of generating a warning signal by calculating a degree of insulation damage based on the magnitude of leakage current.

Referring to FIGS. 2 and 8, the leakage current detection apparatus 200 measures currents in operation 810, and generates a warning signal according to a predetermined threshold.

For example, the leakage current detection apparatus 200 determines whether a magnitude difference between currents measured at both ends of a battery module in question is greater than a second threshold in operation 820. If a result of the determination is that the magnitude difference is greater than the second threshold, the leakage current detection apparatus 200 generates a power cutoff signal in operation 830.

On the other hand, if the result of the determination is that the magnitude difference is less than the second threshold, the leakage current detection apparatus 200 further determines whether the magnitude difference is greater than a first threshold in operation 840. If a result of the determination is that the magnitude difference is less than the first threshold, the leakage current detection apparatus 200 determines that no current leakage occurs, and accordingly the leakage current detection apparatus 200 returns to operation 810 in which the leakage current detection apparatus 200 measures currents again. If the result of the determination is that the magnitude difference is greater than the first threshold, the leakage current detection apparatus 200 generates a warning signal to inform the user or the system that current leakage is occurring in operation 850.

Figure 9:
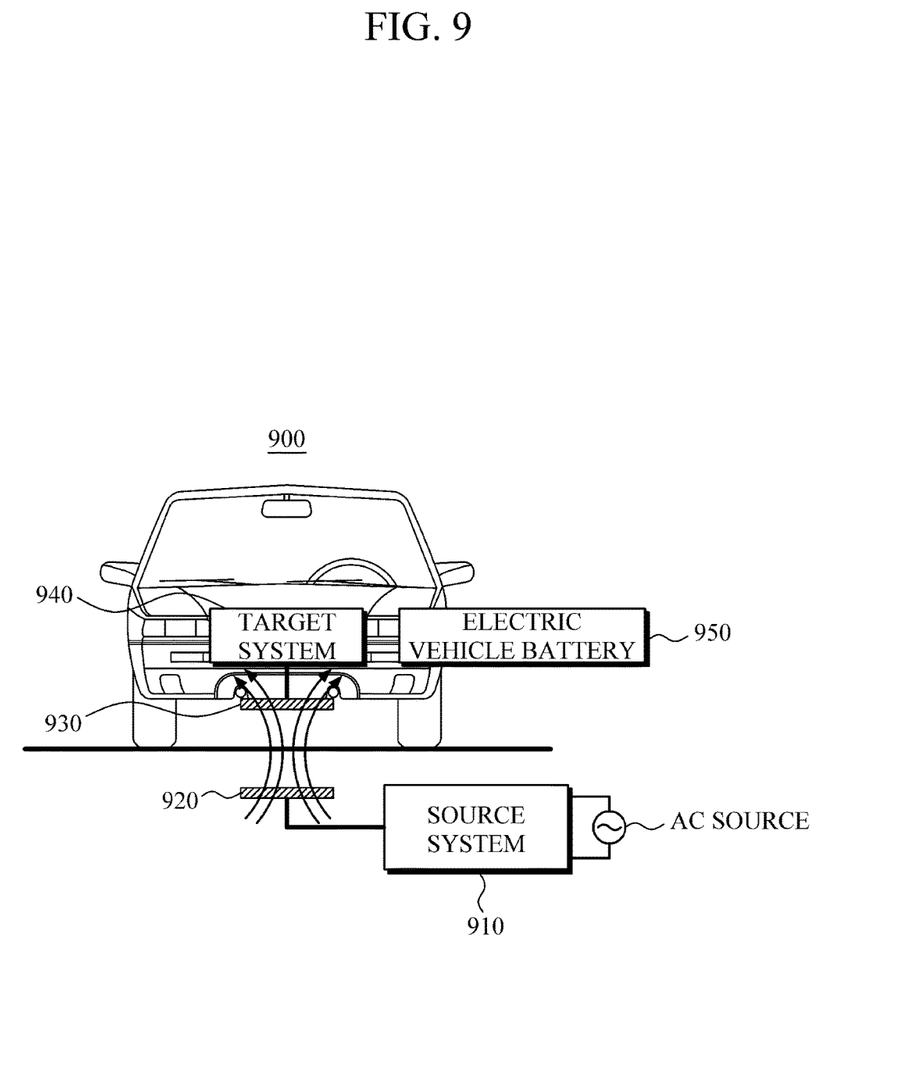
FIG. 9 is a diagram illustrating an example of an electric vehicle charging system.

FIG. 9 is a diagram illustrating an example of an electric vehicle charging system.

Referring to FIG. 9, an electric vehicle charging system 900 includes a source system 910, a source resonator 920, a target resonator 930, a target system 940, and an electric vehicle battery 950. The target resonator 930, the target system 940, and the electric vehicle battery 950 are mounted in an electric vehicle. However, this is just an example, and the target resonator 930, the target system 940, and the electric vehicle battery 950 may be mounted in a hybrid electric vehicle, an electric bicycle, or any other conveyance known to one of ordinary skill in the art that receives its motive power from a battery.

The source resonator 920 and the target resonator 930 have a same resonant frequency, which may be in a band of a few kilohertz (kHz) to tens of megahertz (MHz).

The source system 910 and the source resonator 920 operate as a source to transmit wireless power at the resonant frequency of the source resonator 920 and the target resonator 930. The target resonator 930 and the target system 940 operate as a target to receive the wireless power transmitted by the source resonator 920.

The source system 910 converts power from an alternating-current (AC) source having, for example, a frequency of 50 or 60 Hz to power having the resonant frequency of the source resonator 920 and the target resonator 930, and supplies the converted power to the source resonator 920. The source resonator 920 transmits the converted power as wireless power having the resonant frequency to the target resonator 930 via magnetic resonance between the source resonator 920 and the target resonator 930. The transmitted wireless power may be tens of watts or higher. The target resonator 930 supplies the power received from the source resonator 920 to the target system 940. The target system 940 converts the received power to a direct-current (DC) charging power suitable for charging the electric vehicle battery 950. The electric vehicle battery 950 is charged by the DC charging power.

For efficient transmission of power, the source resonator 920 and the target resonator 930 need to be aligned with each other. The source resonator 920 and the target resonator 930 are aligned with each other when the target resonator 930 is located at a position enabling a maximum magnetic resonance to occur between the source resonator 920 and the target resonator 930.

When the electric vehicle does not stop at a position at which the source resonator 920 and the target resonator 930 are aligned with each other, the source system 910 may transmit a message to the target system 940 to control the source resonator 920 and the target resonator 930 to be aligned with each other, or to inform an operator of the electric vehicle to adjust the position of the electric vehicle so that the source resonator 920 and the target resonator 930 are aligned with each other.

The electric vehicle battery 950 may be the battery pack 300 illustrated in FIG. 3, or any other battery pack in which a plurality of battery modules are connected in series. The target system 940 may include the leakage current detection apparatus 100 illustrated in FIG. 1 or the leakage current detection apparatus 200 illustrated in FIGS. 2 and 3.

The leakage current detection apparatus 100, the current measurer 110, and the leakage detector 130 illustrated in FIG. 1 and the leakage current detection apparatus 200, the current measurer 210, the leakage detector 230, the charge/discharge determiner 250, the damage detector 270 illustrated in FIGS. 2 and 3, and the source system 910 and the target system 940 illustrated in FIG. 9 that perform the operations described herein with respect to FIGS. 1-9 are implemented by hardware components. Examples of hardware components include controllers, sensors, generators, drivers, memories, comparators, arithmetic logic units, adders, subtractors, multipliers, dividers, integrators, and any other electronic components known to one of ordinary skill in the art. In one example, the hardware components are implemented by computing hardware, for example, by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIGS. 1-9. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 6-8 that perform the operations described herein with respect to FIGS. 1-9 are performed by a processor or a computer as described above executing instructions or software to perform the operations described herein.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An apparatus for detecting leakage current, the apparatus comprising:
   a current measurer configured to measure currents at both ends of a battery module;
   a leakage detector configured to determine whether current is leaking out of the battery module based on the measured currents; and
   a damage detector configured to generate a warning signal in response to a magnitude difference between the measured currents being greater than a first threshold and less than a second threshold, and generate a power cutoff signal in response to the magnitude difference between the measured currents being greater than the second threshold.

2. The apparatus of claim 1, wherein the leakage detector is further configured to compare magnitudes of the measured currents with each other, and determine that current is leaking out of the battery module in response to a result of the comparing being that the magnitude difference between the measured currents is greater than a threshold.

3. The apparatus of claim 1, further comprising a charge/discharge determiner configured to determine whether the battery module is charging or discharging.

4. The apparatus of claim 3, wherein the charge/discharge determiner is further configured to determine whether the battery module is charging or discharging based on a flow direction of the measured currents.

5. The apparatus of claim 4, wherein the current measurer is further configured to measure a current at a positive terminal of the battery module at one end of the battery module, and measure a current at a negative terminal of the battery module at another end of the battery module; and
   the charge/discharge determiner is further configured to determine that the battery module is charging in response to the flow direction of the measured currents indicating that a current is flowing from the positive terminal of the battery module to the negative terminal of the battery module, and determine that the battery module is discharging in response to the flow direction of the measured currents indicating that a current is flowing from the negative terminal of the battery module to the positive terminal of the battery module.

6. The apparatus of claim 3, wherein the current measurer is further configured to measure a current at a positive terminal of the battery module at one end of the battery module, and measure a current at a negative terminal of the battery module at another end of the battery module; and
   the leakage detector is further configured to determine that current is leaking out of the battery module in response to the current measured at the positive terminal of the battery module being greater than the current measured at the negative terminal of the battery module and the charge/discharger determiner determining that the battery module is charging, and determine that current is leaking out of the battery module in response to the current measured at the negative terminal of the battery module being greater than the current measured at the positive terminal of the battery module and the charge/discharger determiner determining that the battery module is discharging.

7. The apparatus of claim 1, wherein the damage detector is further configured to calculate a degree of insulation damage by calculating the magnitude difference between the measured currents.

8. The apparatus of claim 1, wherein the current measurer is further configured to measure the currents using either a hole sensor or a shunt resistor.

9. A method of detecting leakage current, the method comprising:
   measuring currents at both ends of a battery module;
   determining whether current is leaking out of the battery module based on the measured currents;
   generating a warning signal in response to a magnitude difference the measured currents being greater than a first threshold and less than a second threshold; and generating a power cutoff signal in response to the magnitude difference between the measured currents being greater than the second threshold.

10. The method of claim 9, wherein the determining of whether current is leaking out of the battery module comprises:
    comparing magnitudes of the measured currents with each other; and
    determining that current is leaking out of the battery in response to a result of the comparing being that the magnitude difference between the measured currents is greater than a threshold.

11. The method of claim 9, further comprising determining whether the battery module is charging or discharging.

12. The method of claim 11, wherein the determining of whether the battery module is charging or discharging comprises determining whether the battery module is charging or discharging based on a flow direction of the measured currents.

13. The method of claim 12, wherein the measuring comprises:
    measuring a current at a positive terminal of the battery module at one end of the battery module; and
    measuring a current at a negative terminal of the battery module at another end of the battery module; and
    the determining of whether the battery module is charging or discharging based on a flow direction of the measured currents comprises:
    determining that the battery module is charging in response to the flow direction of the measured currents indicating that a current is flowing from the positive terminal of the battery module to the negative terminal of the battery module; and
    determining that the battery module is discharging in response to the flow direction of the measured currents indicating that a current is flowing from the negative terminal of the battery module to the positive terminal of the battery module.

14. The method of claim 11, wherein the measuring comprises:
    measuring a current at a positive terminal of the battery module at one end of the battery module; and
    measuring a current at a negative terminal of the battery module at another end of the battery module; and
    the determining of whether current is leaking out of the battery module comprises:
    determining that current is leaking out of the battery module in response to the current measured at the positive terminal of the battery module being greater than the current measured at the negative terminal of the battery module and a result of the determining of whether the battery module is charging or discharging being that the battery module is charging; and
    determining that current is leaking out of the battery module in response to the current measured at the negative terminal of the battery module being greater than the current measured at the positive terminal of the battery module and a result of the determining of whether the battery module is charging or discharging being that the battery module is discharging.

15. The method of claim 9, further comprising calculating a degree of insulation damage by calculating the magnitude difference between the measured currents.

16. The method of claim 9, wherein the measuring comprises measuring the currents using either a hole sensor or a shunt resistor.

17. An electric vehicle comprising:
    a battery module;
    the apparatus for detecting leakage current of claim 1; and
    a vehicle.

18. The electric vehicle of claim 17, further comprising:
    a target resonator configured to receive wireless power from a source resonator via magnetic resonance between the target resonator and the source resonator, and output the received power; and
    a target system configured to receive the power output from the target resonator, convert the power received from the target resonator to a charging power, and charge the battery module with the charging power.

19. The electric vehicle of claim 18, wherein the target system comprises the current measurer and the leakage detector.

20. An apparatus for detecting leakage current, comprising:
    a current measurer configured to measure current at a positive terminal and to measure current at a negative terminal of a battery module;
    a charge/discharge determiner configured to determine a charging status of the battery module when current flows from the positive terminal to the negative terminal and a discharging status when current flows from the negative terminal to the positive terminal;
    a leakage detector configured to detect current leaking out the battery module based on a current measurement of the current measurer and the charge/discharge status determination; and
    a damage detector configured to generate a warning signal in response to a magnitude difference between the measured currents being greater than a first threshold and less than a second threshold, and generate a power cutoff signal in response to the magnitude difference between the measured currents being greater than the second threshold.

* * * * *